(12) United States Patent
Sugita et al.

(10) Patent No.: US 11,587,921 B2
(45) Date of Patent: Feb. 21, 2023

(54) SEMICONDUCTOR DEVICE

(71) Applicant: DENSO CORPORATION, Kariya (JP)

(72) Inventors: Satoru Sugita, Kariya (JP); Kosuke Yuzawa, Kariya (JP); Susumu Yamada, Kariya (JP); Kenji Komiya, Kariya (JP)

(73) Assignee: DENSO CORPORATION, Kariya (JP)

( * ) Notice: Subject to any disclaimer, the term of this patent is extended or adjusted under 35 U.S.C. 154(b) by 134 days.

(21) Appl. No.: 17/034,678

(22) Filed: Sep. 28, 2020

(65) Prior Publication Data

US 2021/0098442 A1 Apr. 1, 2021

(30) Foreign Application Priority Data

Sep. 30, 2019 (JP) .............................. JP2019-178858

(51) Int. Cl.
*H01L 25/18* (2006.01)
*H01L 23/00* (2006.01)
*H02M 3/158* (2006.01)
*H01L 23/495* (2006.01)
*H01L 23/373* (2006.01)
(Continued)

(52) U.S. Cl.
CPC ........ *H01L 25/18* (2013.01); *H01L 23/49575* (2013.01); *H01L 24/32* (2013.01); *H01L 24/33* (2013.01); *H02M 3/158* (2013.01); *B60L 50/51* (2019.02); *B60L 2210/10* (2013.01); *H01L 23/3736* (2013.01); *H01L 2224/32245* (2013.01); *H01L 2224/33181* (2013.01); *H01L 2924/10253* (2013.01); *H01L 2924/10272* (2013.01); *H01L 2924/12032* (2013.01); *H01L 2924/12036* (2013.01); *H01L 2924/13091* (2013.01); *H02P 27/06* (2013.01)

(58) Field of Classification Search
None
See application file for complete search history.

(56) References Cited

U.S. PATENT DOCUMENTS

2002/0018328 A1* 2/2002 Nakamura .......... H01L 27/0255
361/91.5
2005/0167802 A1* 8/2005 Hirano .................. H01L 25/072
257/E23.092
(Continued)

FOREIGN PATENT DOCUMENTS

GB 2444978 A * 6/2008 ......... H01L 23/4735
JP 2008124430 A * 5/2008 ........... H01L 23/051
(Continued)

*Primary Examiner* — Telly D Green
(74) *Attorney, Agent, or Firm* — Posz Law Group, PLC

(57) ABSTRACT

A semiconductor device includes, a semiconductor element, a wiring member arranged to sandwich the semiconductor element, a sealing resin body. The semiconductor element has an SBD formed thereon with a base material of SiC which is a wide band gap semiconductor. The semiconductor element has two main electrodes on both surfaces. The wiring member includes (i) a heat sink electrically connected to a first main electrode and (ii) a heat sink and a terminal electrically connected to a second main electrode. The semiconductor device further includes an insulator. The insulator has a non-conducting element made of silicon. The insulator has joints on both of two surfaces for mechanical connection of the heat sinks.

16 Claims, 8 Drawing Sheets

(51) Int. Cl.
  *H02P 27/06*      (2006.01)
  *B60L 50/51*      (2019.01)

(56) References Cited

U.S. PATENT DOCUMENTS

| | | | |
|---|---|---|---|
| 2008/0054425 A1* | 3/2008 | Malhan | H01L 24/01 |
| | | | 257/E25.016 |
| 2008/0054439 A1* | 3/2008 | Malhan | H01L 23/5385 |
| | | | 257/E23.071 |
| 2017/0229445 A1* | 8/2017 | Maehara | H01L 27/0288 |
| 2017/0317006 A1* | 11/2017 | Okumura | H02P 27/06 |
| 2022/0077044 A1* | 3/2022 | Mitsumoto | H01L 23/49822 |

FOREIGN PATENT DOCUMENTS

| | | | | |
|---|---|---|---|---|
| JP | 2012-023124 A | 2/2012 | | |
| JP | 2013-187437 A | 9/2013 | | |
| JP | 2015-076562 A | 4/2015 | | |
| JP | 2016-031948 A | 3/2016 | | |
| JP | 2018-018932 A | 2/2018 | | |
| JP | 2019153752 A * | 9/2019 | | H01L 23/3121 |
| WO | WO-2018131276 A1 * | 7/2018 | | H01L 23/3114 |
| WO | WO-2019064904 A1 * | 4/2019 | | G06T 7/0002 |
| WO | WO-2019123818 A1 * | 6/2019 | | H01L 25/07 |

* cited by examiner

⟨WHEN OUTER SURFACE IS COVERED⟩

⟨WHEN OUTER SURFACE CONTACTS WITH CAVITY WALL⟩

SEMICONDUCTOR DEVICE

CROSS REFERENCE TO RELATED APPLICATION

The present application is based on and claims the benefit of priority of Japanese Patent Application No. 2019-178858, filed on Sep. 30, 2019, the disclosure of which is incorporated herein by reference.

TECHNICAL FIELD

The present disclosure generally relates to a semiconductor device.

BACKGROUND INFORMATION

When a wide bandgap semiconductor having a wider bandgap than silicon is used as a base material of the semiconductor element, the element size can be made smaller than that made of silicon. When the element size is reduced, the stress acting on the semiconductor element increases. In view of the above or other points not mentioned, there is a need for further improvements in semiconductor devices.

SUMMARY

According to the disclosed semiconductor device, the semiconductor element has a wide band gap semiconductor as a base material. However, not only the semiconductor element but also an insulator is interposed between the first wiring member and the second wiring member. In such manner, the stress on the semiconductor element during molding of the sealing resin body is reduced because some forces are distributed to the insulator. In such manner, a highly reliable semiconductor device can be provided.

The disclosed aspects in the specification adopt different technical solutions from each other in order to achieve their respective objectives. Reference numerals in parentheses described in claims and this section exemplarily show corresponding relationships with parts of embodiments to be described later and are not intended to limit technical scopes. The objects, features, and advantages disclosed in this specification will become apparent by referring to following detailed descriptions and accompanying drawings.

BRIEF DESCRIPTION OF THE DRAWINGS

Objects, features, and advantages of the present disclosure will become more apparent from the following detailed description made with reference to the accompanying drawings, in which.

DETAILED DESCRIPTION

First Embodiment, FIGS. 1-4

A semiconductor device according to the present embodiment is applied to a power conversion device. The power conversion device is applied to, for example, a vehicle drive system. The power conversion device can be applied to vehicles such as a fuel cell vehicle (FCV), an electric vehicle (EV), and a hybrid vehicle (HV), for example.

Figure 1:
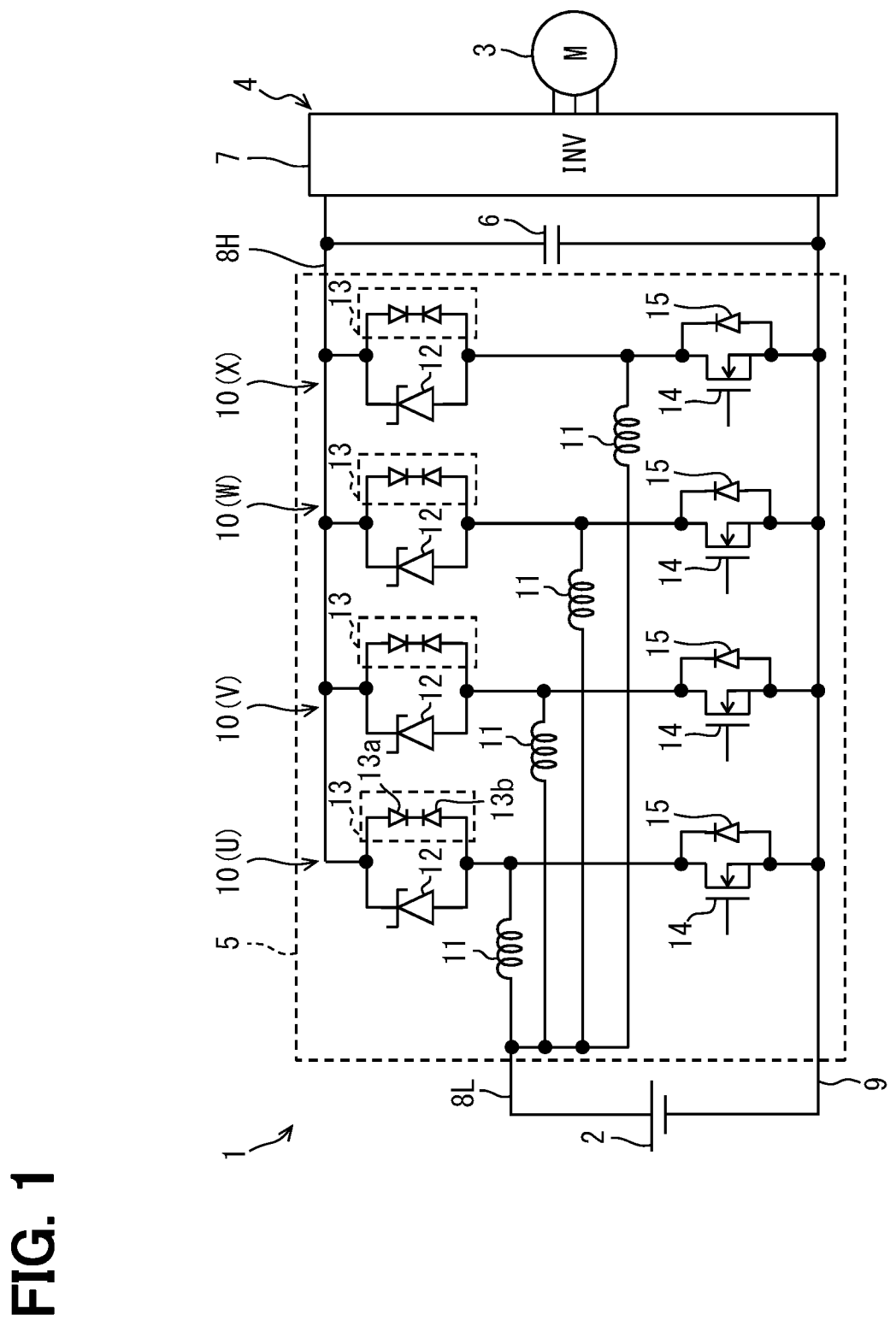
FIG. 1 is a circuit diagram of a power conversion device to which a semiconductor device according to a first embodiment is applied.

<Vehicle Drive System, FIG. 1>

First, a schematic configuration of a vehicle drive system is described. As shown in FIG. 1, a vehicle drive system 1 includes a direct current (DC) power supply 2, a motor 3, and a power conversion device 4.

The DC power supply 2 is, for example, a lithium ion battery, a nickel hydrogen battery, or a fuel cell. The motor 3 is a three-phase alternating current (AC) type rotating electric machine. The motor 3 functions as a source of driving force of the vehicle, that is, an electric motor. The power conversion device 4 performs power conversion between the DC power supply 2 and the motor 3.

<Power Converter>

Next, the power conversion device 4 is described. As shown in FIG. 1, the power conversion device 4 includes a converter 5, a smoothing capacitor 6, and an inverter 7. The converter 5 and the inverter 7 are power conversion sections. The converter 5 is a DC-DC converter that converts a DC voltage into a DC voltage having a different voltage value.

A P line, which is a power line on a high potential side, includes a VH line 8H and a VL line 8L. The VL line 8L is connected to a positive terminal of the DC power supply 2. The converter 5 is provided to a position between the VH line 8H and the VL line 8L, and a potential of the VH line 8H is higher than a potential of the VL line 8L. An N line 9, which is a power line on a low potential side, is connected to a negative terminal of the DC power supply 2.

The smoothing capacitor 6 is connected to a position between the VH line 8H and the N line 9. The smoothing capacitor 6 is provided at a position between the converter 5 and the inverter 7, and is connected in parallel with the converter 5 and the inverter 7. The smoothing capacitor 6 smooths the DC voltage from the converter 5, for example, and accumulates electric charges of the DC voltage. The voltage across the smoothing capacitor 6 becomes a high DC voltage for driving the motor 3.

The inverter 7 is connected to a position between the VH line 8H and the N line 9. The inverter 7 converts the DC power boosted by the converter 5 into the AC power suitable for driving the motor 3, and supplies the AC power to the motor 3. The inverter 6 is a DC-AC converter. A three-phase inverter is used as the inverter 7. The power conversion device 4 may further include a filter capacitor (not shown). The filter capacitor is connected to a position between the DC power supply 2 and the converter 5 and between the VL line 8L and the N line 9.

<Converter>

Next, the converter 5 is described. As shown in FIG. 1, the converter 5 includes a leg 10 and a reactor 11 for each of four phases. In FIG. 1, reference numerals in parentheses added to the leg 10 indicate which of a U phase, a V phase, a W phase, and an X phase the relevant leg 10 belongs to: 10(U), 10(V), 10(W), and 10(X). The converter 5 of the present embodiment does not have a step-down function but has a step-up (i.e., booster) function.

The leg 10 is connected to a position between the VH line 8H and the N line 9. The plurality of legs 10 are connected in parallel with each other. The legs 10 of respective phases have a common configuration. The leg 10 is an upper and lower arm circuit in which the upper arm and the lower arm are connected in series at a position between the VH line 8H and the N line 9. The upper arm of the leg 10 has a rectifying element whose forward direction is defined as the one from the DC power source 2 to the smoothing capacitor 6 side. The lower arm of the leg 10 has a switching element.

In the present embodiment, the upper arm of the leg 10 has a Schottky barrier diode 12 which is a rectifying element and a non-conducting element 13. The Schottky barrier diode 12 may be referred to as SBD 12 below. The SBD 12 is formed on a chip having silicon carbide (SiC) as a base material as described later. An anode of the SBD 12 is connected to the VH line 8H.

The non-conducting element 13 is connected in parallel to the SBD 12. The non-conducting element 13 is an element in which a plurality of diodes (i.e., PN diodes) are connected in series so that their forward directions are opposite to each other among them. The non-conducting element 13 is formed on a chip having silicon (Si) as a base material as described later. The non-conducting element 13 includes two PN diodes 13a and 13b. Anodes of the PN diodes 13a and 13b are connected to each other. A cathode of the PN diode 13a is connected to an anode of the SBD 12, and a cathode of the PN diode 13b is connected to a cathode of the SBD 12.

Due to the structure described above, a forward voltage Vf of the non-conducting element 13 has a value larger than a forward voltage Vf of the SBD 12. Therefore, no electric current flows through the non-conducting element 13. Further, the non-conducting element 13 has a breakdown voltage performance equal to or higher than that of the SBD 12. The non-conducting element 13 is configured not to interfere with the operation of the SBD 12 under actual use conditions.

On the other hand, the lower arm of the leg 10 has an n-channel type MOSFET 14 which is a switching element and a diode 15. Like the SBD 12, the MOSFET 14 is formed on a chip having SiC as a base material. A source of the MOSFET 14 is connected to the N line 9. A drain of the MOSFET 14 is connected to the cathode of the SBD 12. The switching operation of the MOSFET 14 is controlled by a control circuit section (not shown).

The diode 15 is connected in antiparallel to the MOSFET 14. The diode 15 is formed on a chip having Si as a base material. An anode of the diode 15 is connected to the drain (of the MOSFET 14), and the cathode is connected to the source (of the MOSFET 14).

One end of the reactor 11 is connected to the positive terminal of the DC power supply 2 via the VL line 8L. The other end of the reactor 11 is connected to a connection point between the upper arm and the lower arm of the leg 10, that is, a connection point between the cathode of the SBD 12 and the drain of the MOSFET 14.

<Semiconductor Device, FIGS. 2-5>

Figure 2:
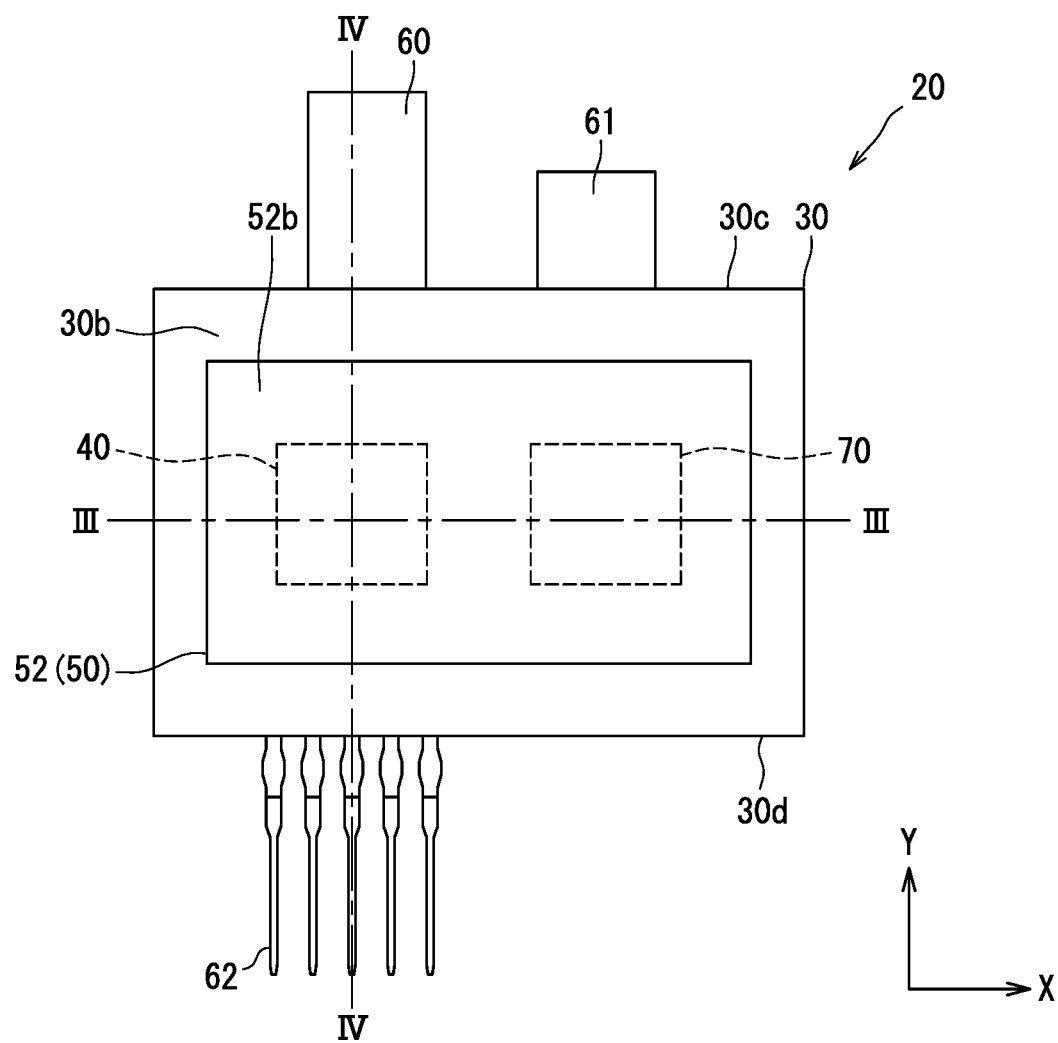
FIG. 2 is a plan view of a semiconductor device.
Figure 3:
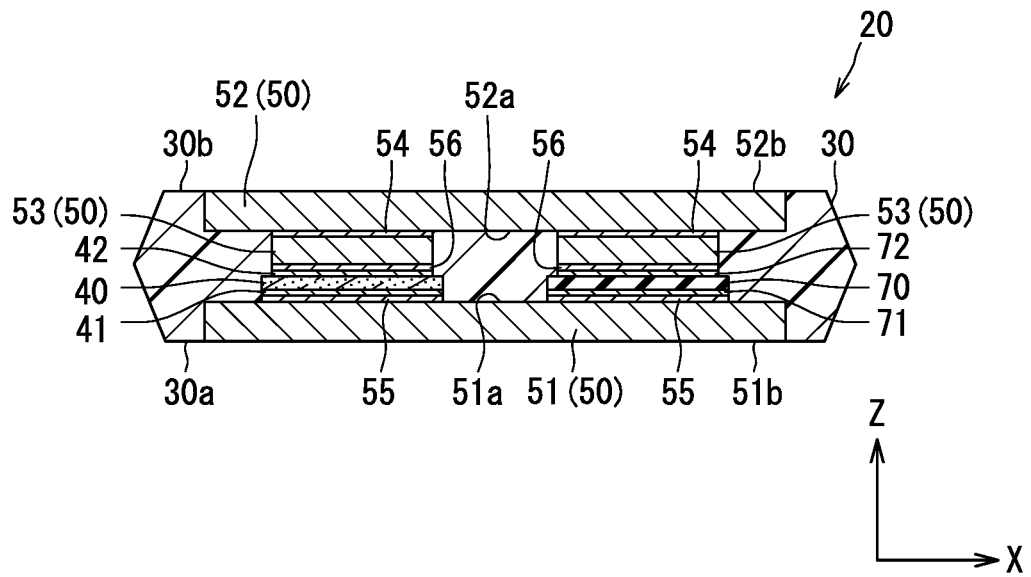
FIG. 3 is a cross-sectional view taken along a line III-III in FIG. 2.
Figure 4:
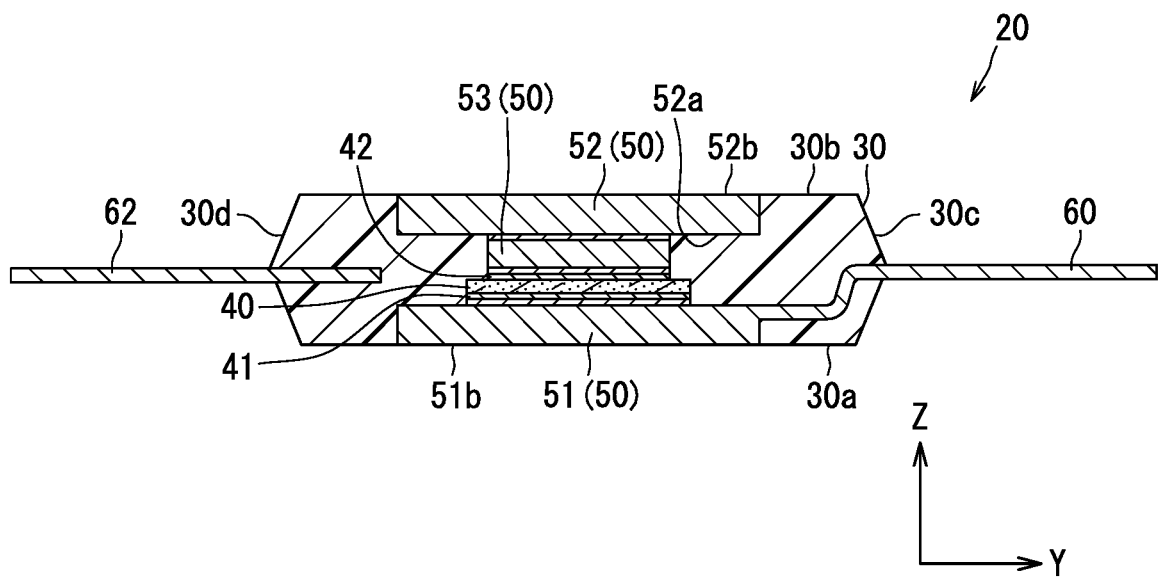
FIG. 4 is a cross-sectional view taken along a line IV-IV of FIG. 2.
Figure 5:
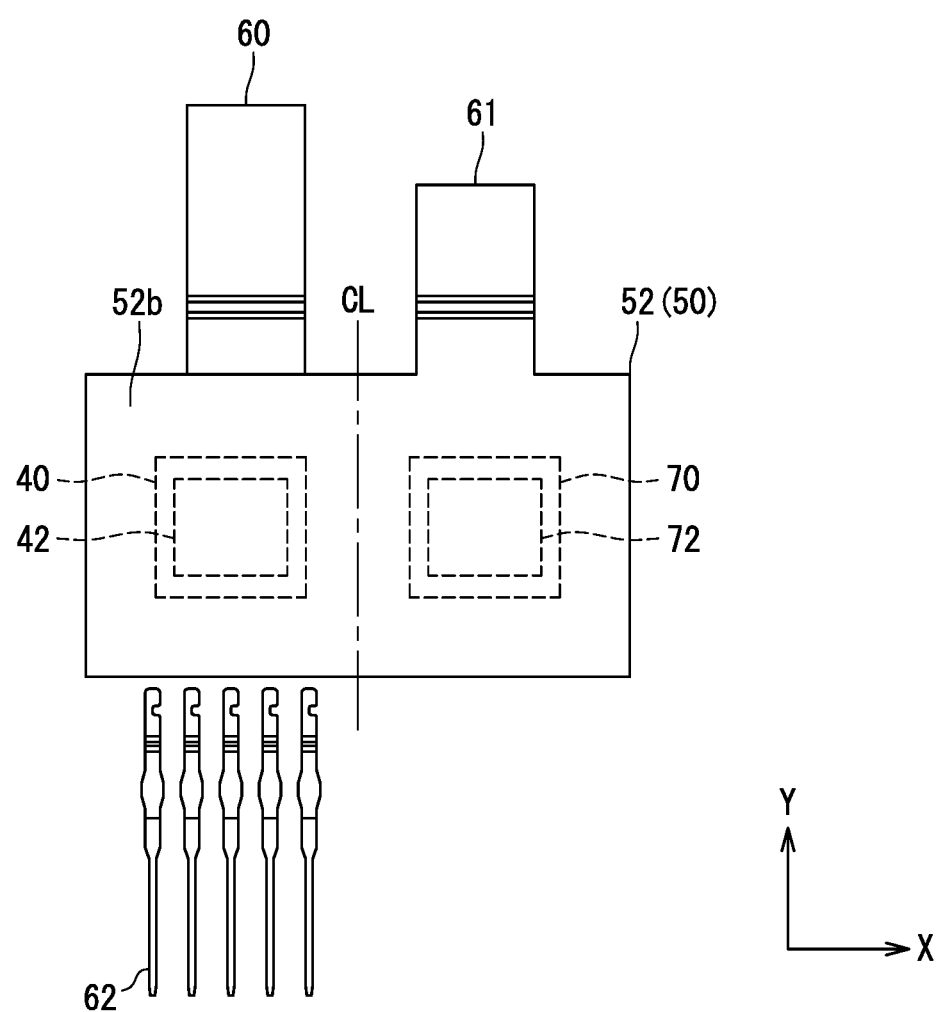
FIG. 5 is a view in which a sealing resin body is omitted.

For convenience, in FIG. 3, the Z direction is UP (and DOWN is the opposite direction). The X direction is RIGHT (and LEFT is the opposite direction). Now, in FIG. 2, the Y direction is REAR (and the opposite direction is FRONT). Returning to FIG. 3, we are viewing a FRONT side of a cross section of the device (cross sectioned along the III-III line in FIG. 2). Next, a semiconductor device that constitutes the converter 5 is described. FIGS. 2 to 5 show a semiconductor device forming the upper arm of the leg 10 for one phase of the converter 5. FIG. 5 is a diagram in which the sealing resin body is omitted from FIG. 2. Hereinafter, a plate thickness direction of the semiconductor element is referred to as a Z direction, and one direction orthogonal to the Z direction, specifically, a longitudinal direction of the wiring member is referred to as an X direction. Further, a direction orthogonal to both of the Z direction and the X direction is referred to as a Y direction. Unless otherwise specified, a shape in a plan view seen from the Z direction, in other words, a shape on an XY plane defined by the X direction and the Y direction is a planar shape. Further, a plan view seen from the Z direction is simply referred to as a plan view. As shown in FIGS. 2 to 5, the semiconductor device 20 includes a sealing resin body 30, a semiconductor element 40, a wiring member 50, main terminals 60 and 61, and an insulator 70.

In FIG. 2, a sealing resin body 30 seals a part of the other elements that form the semiconductor device 20. The rest of the other elements are exposed toward an outside of the sealing resin body 30. The sealing resin body 30 is made of, for example, an epoxy resin. The sealing resin body 30 is molded by, for example, a transfer molding method. The sealing resin body 30 has a substantially rectangular parallelepiped shape. As shown in FIG. 2, the sealing resin body 30 has a substantially rectangular shape in a plan view (viewing downward). In FIG. 3, the sealing resin body 30 has bottom surface 30a and a top surface 30b opposite to the bottom surface 30a in the Z direction. The bottom surface 30a and the top surface 30b are flat surfaces, for example.

The semiconductor element 40 is formed by a chip having a wide bandgap semiconductor having a wider bandgap than silicon as a base material. The semiconductor element 40 may be referred to as a semiconductor chip. The wide band gap semiconductor is a semiconductor having a band gap larger than 1.5 eV, for example. The wide band gap semiconductor includes, for example, silicon carbide (SiC), gallium nitride (GaN), gallium oxide (Ga2O3), and diamond.

The semiconductor element 40 has a lower main electrode 41 and an upper main electrode 42 disposed on the main surfaces that are arranged in the plate thickness direction, that is, in the Z direction. In the semiconductor element 40, an element having a vertical structure is formed so that a main electric current flows between the main electrodes 41 and 42. As described above, the semiconductor element 40 of the present embodiment is one in which the SBD (Schottky Barrier Diode) 12 is formed on a chip having SiC as a base material. A cathode electrode is formed as the lower main electrode 41 on a lower main surface of the semiconductor element 40. An anode electrode is formed as the upper main electrode 42 on an upper main surface opposite to the lower main surface. The main electrode 42 (i.e., an anode electrode) may also be called as a Schottky electrode. The lower main electrode 41 corresponds to the first main electrode, and the upper main electrode 42 corresponds to the second main electrode.

The wiring member 50 sandwiches the semiconductor element 40 in the Z direction. The wiring member 50 is electrically connected to the main electrode. As the wiring member 50, for example, a metal plate made of Cu, a Cu alloy, or the like, or a structure in which a conductor is arranged on at least one surface of an insulating base material can be adopted. A direct bonded copper (DBC) substrate is an example of an insulating substrate on which conductors are arranged. The wiring member 50 of the present embodiment includes heat sinks 51 and 52 and a terminal 53. The lower heat sink 51 is arranged on lower side of the semiconductor element 40. The lower heat sink 51 corresponds to the first wiring member. The upper heat sink 52 and the terminal 53 are arranged on an upper side of the semiconductor element 40. The upper heat sink 52 and the terminal 53 are connected via a solder 54. The upper heat sink 52, the terminal 53, and the solder 54 correspond to the second wiring member.

The heat sinks 51 and 52 are metal members made of Cu, Cu alloy or the like. The heat sinks 51 and 52 serve to conduct heat of the semiconductor element 40 to an outside of the semiconductor device 20. The heat sinks 51 and 52 may also be called a heat dissipation member. The heat sinks 51 and 52 have a substantially rectangular plane shape with its longitudinal side arranged along the X direction. The heat sinks 51 and 52 include (overlap) the semiconductor element 40 in a plan view. The heat sinks 51 and 52 have similar shapes.

The terminal 53 is located in the middle of an electric conduction and heat conduction paths between the semiconductor element 40 (i.e., the main electrode 42) and the heat sink 52. The terminal 53 is formed by including a metal material such as Cu or Cu alloy. The terminal 53 has a columnar body having a substantially rectangular shape in the plan view and having substantially the same size as the main electrode 42 in the plan view. The terminal 53 may be referred to as a metal block body or a relay member.

The lower main electrode 41 of the semiconductor element 40 is connected to a lower inner surface 51a of the heat sink 51 via a solder 55. The upper main electrode 42 is connected to one end of the terminal 53 via a solder 56. The other end of the terminal 53 is connected to an inner surface 52a of the heat sink 52 via the solder 54 described above.

Most of the heat sinks 51 and 52 are covered with the sealing resin body 30. Lower outer surface 51b (of lower heat sink 51) and upper outer surface 52b (of upper heat sink 52) are exposed from the sealing resin body 30. The outer surfaces 51b and 52b may also be referred to as a heat dissipation surfaces or exposed surfaces. The lower outer surface 51b is substantially flush with the bottom surface 30a of the sealing resin body 30, and the upper outer surface 52b is substantially flush with the top surface 30b.

The left main terminal 60 electrically connects the lower main electrode 41 to an external device. The lower heat sink 51 is located between the left main terminal 60 and the lower main electrode 41. The right main terminal 61 electrically connects the upper main electrode 42 to the external device. The upper heat sink 52 is located between the right main terminal 61 and the upper main electrode 42.

The left main terminal 60 extends rearward from the lower heat sink 51. The right main terminal 61 extends rearward from the upper heat sink 52. Alternatively, the right main terminal 61 may extend rearward from the terminals 53. The main terminals 60 and 61 may also be configured as separate members from the corresponding heat sinks 51 and 52, and may be joined thereto as an extension, or may be a single unified construction. In the present embodiment, the main terminals 60 and 61 extend from the corresponding heat sinks 51 and 52 as respective continuous metal members.

The main terminal 60 is extended from the heat sink 51 in the Y direction (rearward) and protrudes from a rear side surface 30c of the sealing resin body 30 toward the outside thereof. The main terminal 61 extends from the heat sink 52 in the Y direction, and protrudes to the outside from the same rear side surface 30c as the main terminal 60. The semiconductor device 20 further includes a plurality of dummy terminals 62. The dummy terminal 62 is a terminal that has the same structure as a signal terminal 162 described later, but does not provide an electrical connection function, in other words, a wiring function. The dummy terminals 62 are NOT electrically connected to the semiconductor element 40 components, and NOT to the wiring member 50. The dummy terminal 62 is extended in the Y direction and protrudes from a front side surface 30d of the sealing resin body 30 toward the outside thereof. The front side surface 30d is a surface opposite to the rear side surface 30c in the Y direction.

The dummy terminal 62, together with the heat sink 51 and the main terminal 60, is configured as a lead frame which is a common member. The lead frame is a component having different width part to part (e.g., partially thinned). In the lead frame, a heat sink 51 part is thick, and a main terminal 60 and dummy terminal 62 parts are thin. Unnecessary parts of the lead frame, such as tie bars between the dummy terminals, are cut (i.e., removed) after the molding of the sealing resin body 30. Note that a heat sink 52 part is thicker than a main terminal 61 part in an integrally-provided, continuous metal member of the heat sink 52 and the main terminal 61.

The insulator 70 is located in the sealing resin body 30. The insulator 70 is sandwiched by the wiring member 50 together with the semiconductor element 40. The insulator 70 has an insulating function of electrically separating the lower heat sink 51 from the upper heat sink 52. The insulator 70 has a joint 71 for mechanically connecting to the lower heat sink 51 (optionally via solder 55), and joint 72 for mechanically connecting to the solder 56, the terminal 53 and the upper heat sink 52.

As described above, the insulator 70 of the present embodiment has the non-conducting element 13 formed on the chip having silicon as a base material. The insulator 70 has the same thickness as the semiconductor element 40. The insulator 70 has substantially the same planar shape and size as the semiconductor element 40. That is, the insulator 70 has almost the same size as the semiconductor element 40. The joint 71 is formed on the surface of the insulator 70 on a first wiring member side thereof, and the joint 72 is formed on the surface on a second wiring member side thereof. The joints 71 and 72 are metal members provided to establish mechanical connection with the wiring member 50. The joint 72 has substantially the same planar shape and size as the main electrode 42.

The second wiring member has two terminals 53, and one of the terminals 53 is arranged at a position overlapping the main electrode 42 of the semiconductor element 40 in the plan view. The other one of the terminals 53 is arranged at a position overlapping the joint 72 of the insulator 70 in the plan view. The two terminals 53 are provided as a common member (i.e., as the same part). The joint 71 is connected to the inner surface 51a of the heat sink 51 via the solder 55. The joint 72 is connected to one end of the terminal 53 via the solder 56. The upper joint 71 corresponds to a first joint, and the lower joint 72 corresponds to a second joint.

As shown in FIG. 5, the insulator 70 is located rightward of the semiconductor element 40. The semiconductor element 40 is arranged in a left region and the insulator 70 is arranged in a right region with respect to a virtual center line CL of the wiring member 50 extending perpendicular to the longitudinal direction thereof. Specifically, the insulator 70 and the semiconductor element 40 are arranged in substantial mirror symmetry with respect to the center line CL.

As described above, in the semiconductor device 20, the sealing resin body 30 seals the semiconductor element 40 and the insulator 70 that form the upper arm of the leg 10 for one phase. The sealing resin body 30 integrally seals the semiconductor element 40, the insulator 70, a part of the heat sink 51, a part of the heat sink 52, the terminal 53, a part of each of the main terminals 60 and 61, and a part of each of the dummy terminals 62.

The semiconductor element 40 is arranged at a position between the heat sinks 51 and 52 in the Z direction. (The semiconductor element 40 is disposed at an in-between position of an arrangement/stack of the heat sinks 51 and 52 along the Z direction.) Thereby, the heat of the semiconductor element 40 can be radiated/dissipated to both sides in the Z direction. The semiconductor device 20 has a double-sided heat dissipation structure. The outer surface 51b of the heat sink 51 is substantially flush with the bottom surface 30a of the sealing resin body 30. The outer surface 52b of the heat sink 52 is substantially flush with the top surface 30b of the sealing resin body 30. Since the outer surfaces 51b and 52b are exposed surfaces, heat dissipation can be improved.

Figure 6:
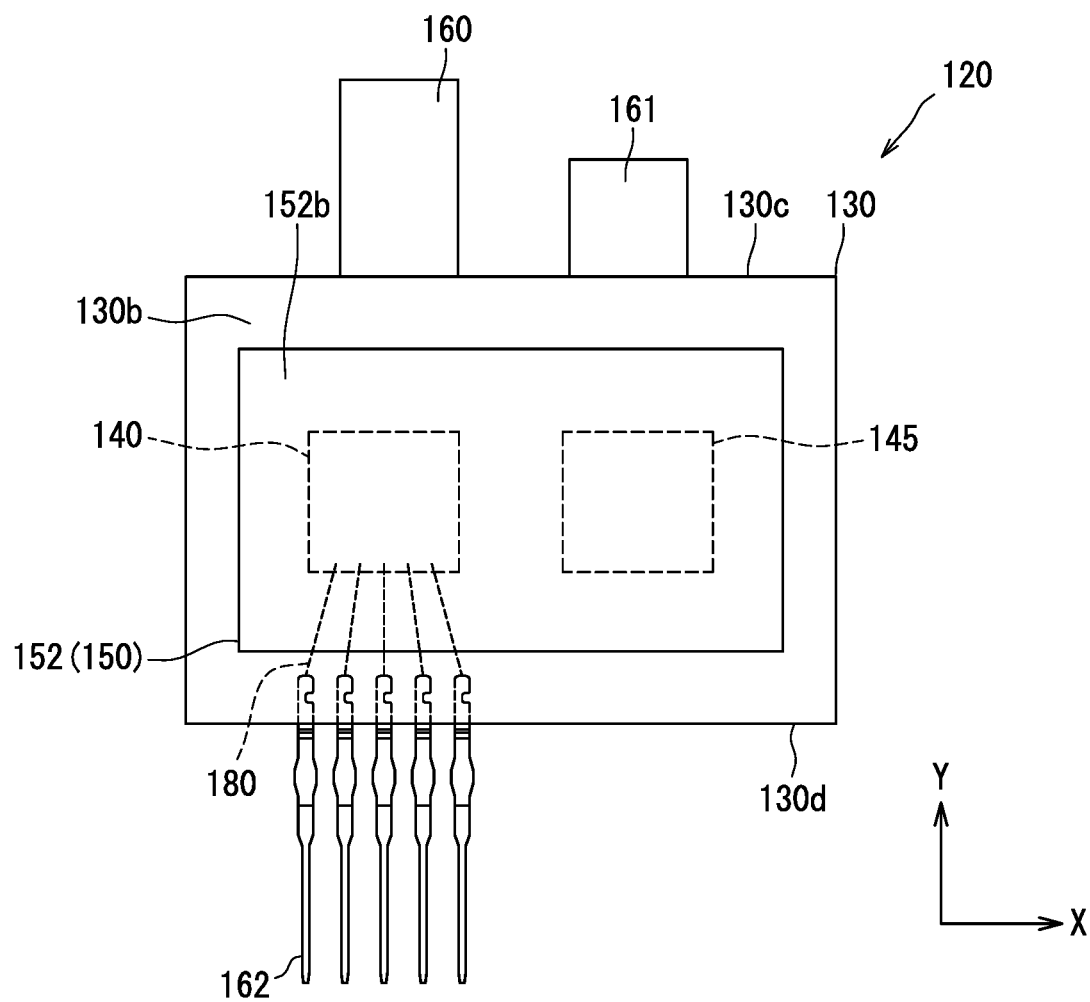
FIG. 6 is a reference diagram of a semiconductor device of another arm.

FIG. 6 is a reference diagram showing a semiconductor device 120 forming the lower arm of the leg 10 for one phase of the converter 5. FIG. 2 corresponds to FIG. 6. The semiconductor device 120 has the same configuration as the semiconductor device 20. In the semiconductor device 120, a semiconductor element 140 is arranged instead of the semiconductor element 40. Further, a semiconductor element 145 is arranged in place of the insulator 70, and the signal terminal 162 is arranged in place of the dummy terminal 62. A sealing resin body 130 corresponds to the sealing resin body 30, and a wiring member 150 corresponds to the wiring member 50. Main terminals 160 and 161 correspond to the main terminals 60 and 61. The main terminals 160 and 161 protrude toward the outside from a side surface 130c of the sealing resin body 130.

Like the semiconductor element 40, the semiconductor element 140 uses a wide band gap semiconductor, specifically, SiC as a base material. The MOSFET 14 described above is formed in the semiconductor element 140. The semiconductor element 140 has main electrodes (not shown) on both sides in the Z direction. One of the main electrodes is a drain electrode and the other one is a source electrode. The drain electrode is soldered to a heat sink (not shown) that forms the wiring member 150. The source electrode is connected to the heat sink 152 via a terminal (not shown). The semiconductor element 140 is different from the semiconductor element 40 in the element formed on the chip, but the semiconductor material constituting the base material, the planar shape and size, and the thickness are almost the same as the semiconductor element 40.

Like the insulator 70, the semiconductor element 145 uses Si as a base material. The diode 15 described above is formed in the semiconductor element 145. The semiconductor element 140 has main electrodes (not shown) on both sides in the Z direction. One of the main electrodes is a cathode electrode and the other one is an anode electrode. The cathode electrode is soldered to the same heat sink as the drain electrode. The anode electrode is connected to the same heat sink 152 as the source electrode via the terminal. Although the semiconductor element 145 is different from the insulator 70 in terms of the element formed on the chip, the semiconductor material, the planar shape and the size, and the thickness of the base material are substantially the same as those of the insulator 70.

The signal terminal 162 is an external connection terminal that provides an electrical connection function. The signal terminal 162 is connected to a pad (not shown) of the semiconductor element 140 via a bonding wire 180. The pad is formed on the same main surface as the source electrode in the semiconductor element 140. The signal terminal 162 protrudes toward the outside from the side surface 130d of the sealing resin body 130. The side surface 130d is a surface opposite to the side surface 130c. The structure of the signal terminal 162 is the same as that of the dummy terminal 62. In FIG. 6, a portion of the signal terminal 162 covered with the sealing resin body 130 and the bonding wire 180 are indicated by broken lines.

The signal terminal 162 is formed/provided as a lead frame including (i) a heat sink to which the drain electrode of the semiconductor element 140 and the cathode electrode of the semiconductor element 145 are connected, and (ii) the main terminal 160. This lead frame is a member (i.e., a common component) common to the (above-described) lead frame including the heat sink 51, the main terminal 60, and the dummy terminal 62 that form the semiconductor device 20.

Therefore, the semiconductor device 20 forming an upper arm can be formed by the same manufacturing process using the same member as the semiconductor device 120 forming a lower arm. This makes it possible to reduce the manufacturing time and cost, for example. Further, the signal terminal 162 of the semiconductor device 120 is mounted on a circuit board on which at least a part of the control circuit unit described above is formed. In the present embodiment, the semiconductor device 20 has the same configuration as the semiconductor device 120 and has the dummy terminal 62. Therefore, the dummy terminal 62 can be mounted on the circuit board. The semiconductor device 20 is held on the circuit board by the dummy terminals 62.

<Method of Manufacturing Semiconductor Device>

Next, a manufacturing method of the semiconductor device 20 is described.

First, a connected structure in which the semiconductor element 40 and the insulator 70 are sandwiched between or by the wiring members 50 is formed.

More specifically, (i) a lead frame including the heat sink 51, the main terminal 60, and the dummy terminal 62, and (ii) the heat sink 52 including a series of the main terminals 61 are prepared together with the semiconductor element 40, the insulator 70 and the terminal 53. Then, the semiconductor element 40 and the insulator 70 are disposed on the inner surface 51a of the heat sink 51 via the solder 55, respectively. Or, for example, the terminals 53, which are pre-soldered on both sides, are disposed on the semiconductor element 40 with the solder 56 facing the semiconductor element 40 side. The terminal 53 is disposed on the insulator 70 in the same manner.

The semiconductor device 20 having a double-sided heat dissipation structure is sandwiched from both sides in the Z direction by a cooler (not shown), for example. Therefore, high parallelism of the surfaces in the Z direction and high dimensional accuracy between the parallel surfaces are required. Therefore, the solder 54 is configured in an amount capable of absorbing the height variation of the semiconductor device 20. That is, a large amount of solder 54 is disposed. In other words, the solder 54 is configured to be thicker than the solders 55 and 56. Then, in such an arrangement state, a first reflow is performed. Such arrangement makes it possible to obtain a stacked body in which the semiconductor element 40, the insulator 70, the heat sink 51, and the terminal 53 are integrally connected to have one body.

Next, the heat sink 52 is disposed on one surface of a pedestal not shown so that the inner surface 52a faces upward. Then, the above-mentioned laminated body is disposed on the heat sink 52 so that the solder 54 faces the heat sink 52, and a second reflow is performed. In the second reflow, a load is applied in the Z direction from the heat sink 51 side so that the height of the semiconductor device 20 has a predetermined height/dimension. For example, by applying a load, a spacer (not shown) is brought into contact with both of the inner surface 51a of the heat sink 51 and one surface of the pedestal. In such manner, the height of the semiconductor device 20 is set to have the predetermined height.

By performing the second reflow, the stacked body and the heat sink 52 having a series of the main terminals 61 are integrated to form a connected structure in one body. The solder 54 absorbs height variations due to dimensional tolerances of components constituting the semiconductor device 20 and assembly tolerances.

After forming the connected structure, the sealing resin body 30 is molded. In the present embodiment, a transfer mold method is adopted. The connected structure is placed in a mold, and the sealing resin body 30 is molded. In the present embodiment, the sealing resin body 30 is molded so that the heat sinks 51 and 52 are completely covered, and cutting is performed after the molding. The sealing resin body 30 is cut together with a part of the heat sinks 51 and 52. In such manner, the outer surfaces 51b and 52b are exposed from the sealing resin body 30. The outer surface 51b is substantially flush with the bottom surface 30a, and the outer surface 52b is made substantially flush with the top surface 30b.

Next, the semiconductor device 20 can be obtainable by removing a tie bar or the like (not shown).

Note that the sealing resin body 30 may be molded in a state where the outer surfaces 51b and 52b are pressed against a cavity wall surface of the molding die and brought into close contact with each other. In such case, when the sealing resin body 30 is molded (i.e., at the time when the molding is complete), the outer surfaces 51b and 52b are (already) exposed from the sealing resin body 30. Therefore, cutting after molding is unnecessary. Also, though an example in which reflow is performed twice has been shown above, the present invention is not limited to such example. The connected structure may be formed by one reflow process. Alternatively, the connected structure may be formed by a solder die bonder method or the like without performing reflow.

Summary of First Embodiment

Wide band gap semiconductors such as SiC have characteristics such as higher dielectric breakdown field strength, higher saturation speed, and higher thermal conductivity than Si. Therefore, if the performance is equivalent, the element size can be made smaller than that of Si. In general, when the element size is reduced, so is the heat radiation/dissipation area size, causing difficulty in dissipation of the generated heat. The wide band gap semiconductor has a higher thermal conductivity and a higher thermal rating than Si, thereby allowing/enabling an element size reduction. The cost can also be reduced by reducing the element size.

Figure 7A:
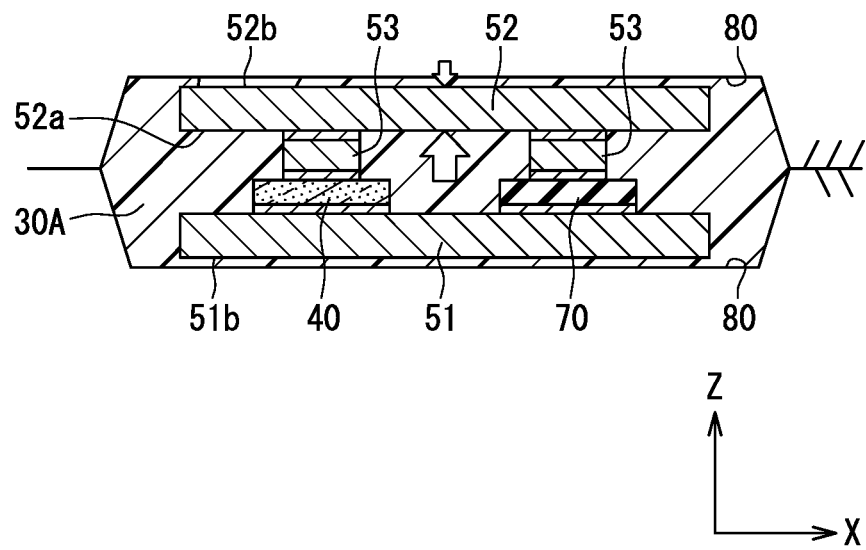
FIG. 7A and FIG. 7B are, respectively, a diagram of an effect of an insulator.

As described above, the semiconductor device 20 of the present embodiment includes the semiconductor element 40 having a wide band gap semiconductor as a base material. The semiconductor element 40 has a smaller element size than a configuration in which an element having equivalent performance is formed on a chip having Si as a base material. FIGS. 7A/7B show a step of filling a mold cavity with a resin 30A to form the sealing resin body 30. As shown in FIG. 7A, when the sealing resin body 30 is formed so as to cover the outer surfaces 51b and 52b of the heat sinks 51 and 52, for example, a gap between the outer surface 52b of the heat sink 52 and a cavity wall surface 80 left un-filled with the resin 30A may sometimes be formed. In such case, a difference is caused between a force that is applied to the inner surface 52a of the heat sink 52 from the resin 30A and a force that is applied to the outer surface 52b from the resin 30A. That is, when the forces on the outer and inner surfaces are inequivalent (i.e., when hydrostatic pressure is not achieved by the forces acting on both surfaces), stress acts on a column portion that mechanically connects the heat sinks 51 and 52. That is, stress acts on the semiconductor element 40.

If only the semiconductor element 40 having a small element size is disposed at a position between the heat sinks 51 and 52, stress concentrates on the semiconductor element 40. For example, stress concentrates on the solder joint between the semiconductor element 40 and the wiring member 50. In the present embodiment, the insulator 70 also functions as a column that mechanically connects the heat sinks 51 and 52, thereby distributing/releasing stress that acts during molding of the sealing resin body 30 toward the insulator 70. Therefore, stress concentration on the semiconductor element 40 can be suppressed. In such manner, a highly reliable semiconductor device 20 can be provided.

Figure 7B:
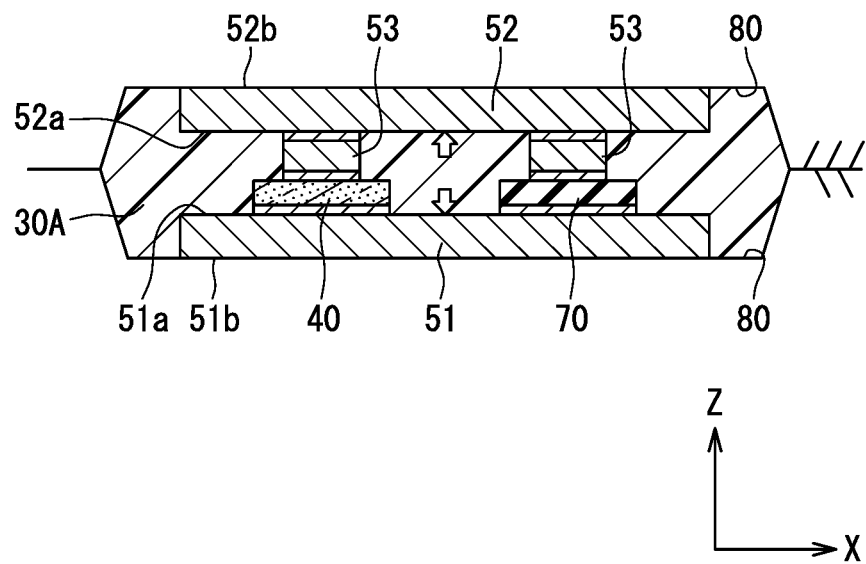

When the sealing resin body 30 is molded by bringing the outer surfaces 51b, 52b into contact with the cavity wall surface 80 (FIG. 7B), a direction of the force received by the inner surface 51a of the heat sink 51 from the resin 30A and a direction of the force received by the inner surface 52a of the heat sink 52 from the resin 30A are opposite to each other. Therefore, the semiconductor element 40 is subjected to (i.e., receives) stress in a pulling direction toward both sides in the Z direction. In the present embodiment, since the insulator 70 is present, the stress that acts at the time of molding the sealing resin body 30 is distributed toward the insulator 70. Therefore, stress concentration on the semiconductor element 40 can be suppressed. In such manner, a highly reliable semiconductor device 20 can be provided. In FIGS. 7A/7B, the force received by the heat sink receives from the resin is indicated by a white arrow.

In the present embodiment, as the insulator 70, the non-conducting element 13 formed on a chip having Si as a base material is adopted. Therefore, the function of mechanically connecting the wiring members 50 is achieved, while the operation of the semiconductor element 40 is not hindered. The non-conducting element 13 has a structure in which the PN diodes 13a and 13b are connected in opposite directions, and can be easily formed on a semiconductor substrate.

The arrangement direction of the semiconductor element 40 and the insulator 70 is not limited to the above example. For example, the lateral direction of the wiring member 50 may be set as the arrangement direction. However, the X direction, which is the longitudinal direction of the wiring member 50, is set as the arrangement direction. In such manner, it is possible to suppress an increase in the size/volume of the wiring member 50, and thus of the semiconductor device 20. For example, in the heat sink 52, a rotational moment may be generated due to the difference in the forces acting on the inner surface 52a and the outer surface 52b. The rotational moment is particularly large in the longitudinal direction of the heat sink 52, but the rotational moment can be suppressed by making the arrangement direction the longitudinal direction. Also by such arrangement, the stress acting on the semiconductor element 40 can be reduced.

Particularly, in the present embodiment, the semiconductor element 40 is arranged in one region in the longitudinal direction with respect to the virtual center line CL of the wiring member 50 in the longitudinal direction, and the insulator 70 is arranged in the other region. Therefore, the rotational moment can be effectively cancelled by the semiconductor element 40 and the insulator 70 which are located on the left and right sides, for example, in the plan view with respect to the rotation axis.

Although the non-conducting element 13 is formed by the two PN diodes 13a and 13b, the non-conducting element 13 is not limited to such configuration. A configuration in which three or more PN diodes are connected in series may be adopted such that the forward directions of adjacent PN diodes are opposite to each other among the three or more diodes.

Figure 8:
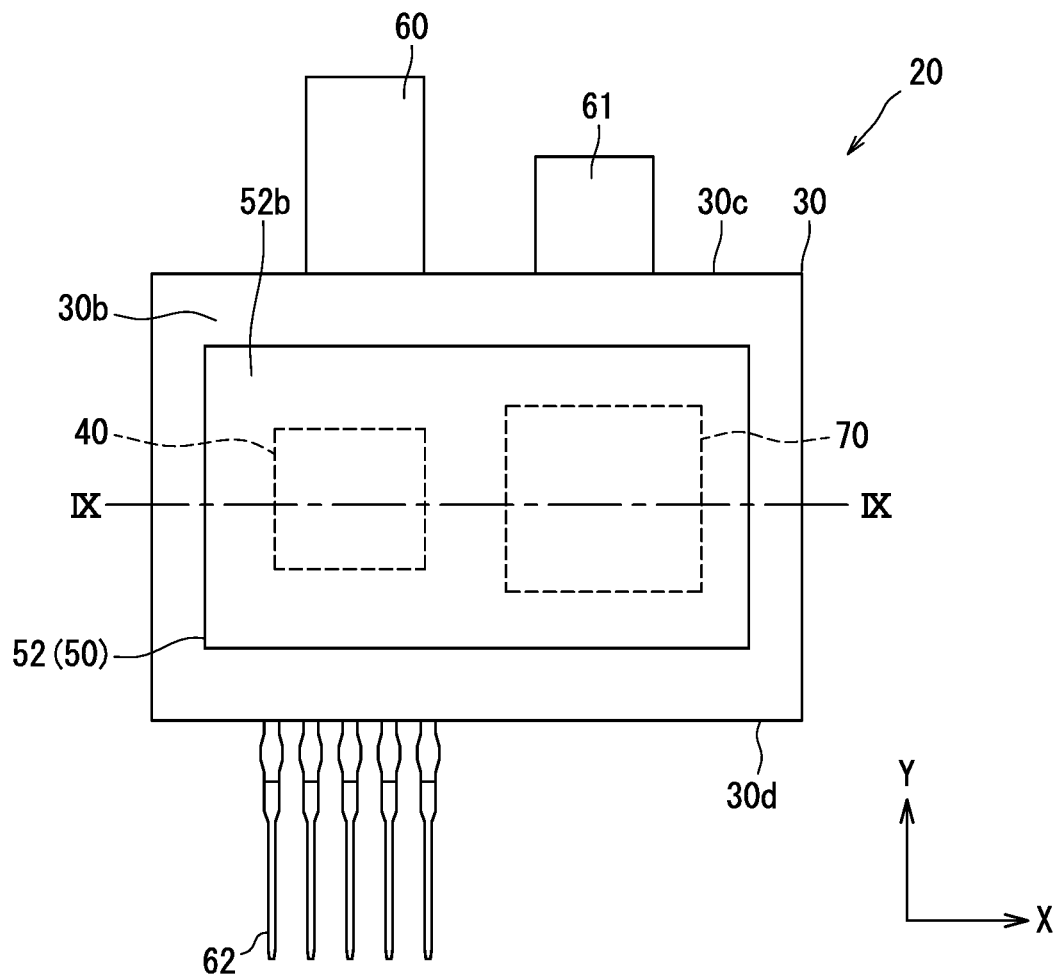
FIG. 8 is a plan view of a semiconductor device according to a second embodiment.
Figure 9:
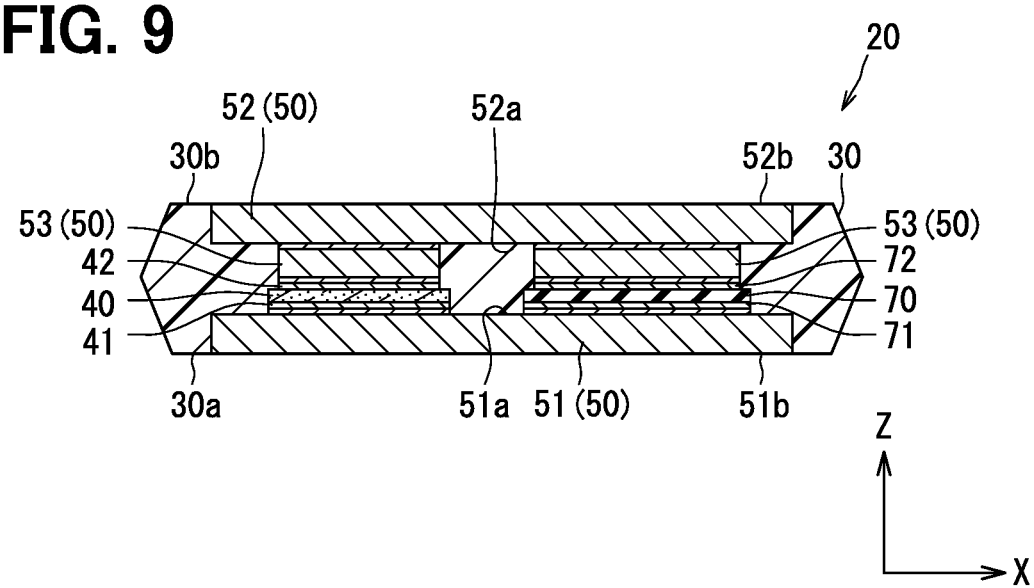
FIG. 9 is a sectional view taken along a line IX-IX in FIG. 8.

Second Embodiment, FIGS. 8, 9

The second embodiment is a modification of a preceding embodiment as a basic configuration and may incorporate description thereof. In the preceding embodiment, the area size of the insulator 70 is made substantially equal to that of the semiconductor element 40 in a plan view. Also, an example in which only one insulator 70 is provided is shown. However, the present disclosure is not limited to such an example.

FIGS. 8 and 9 show the semiconductor device 20 of the present embodiment. Similar to the preceding embodiment, one semiconductor element 40 and one insulator 70 are arranged between the wiring members 50. The area size of the insulator 70 is larger than the area size of the semiconductor element 40 in a plan view. In such manner, the area size of the solder joints between the heat sinks 51 and 52 and the terminal 53 that form the wiring member 50 is larger for a connection portion of the insulator 70 than a connection portion of the semiconductor element 40. The other configuration is the same as that of the preceding embodiment.

Summary of Second Embodiment

In the present embodiment, the insulator 70 is larger than the semiconductor element 40 in the plan view, thereby the stress acting on the insulator 70 is increased as compared with the preceding embodiment. In such manner, the stress acting on the semiconductor element 40 can be further reduced. Therefore, the reliability of the semiconductor device 20 can be further improved.

Figure 10:
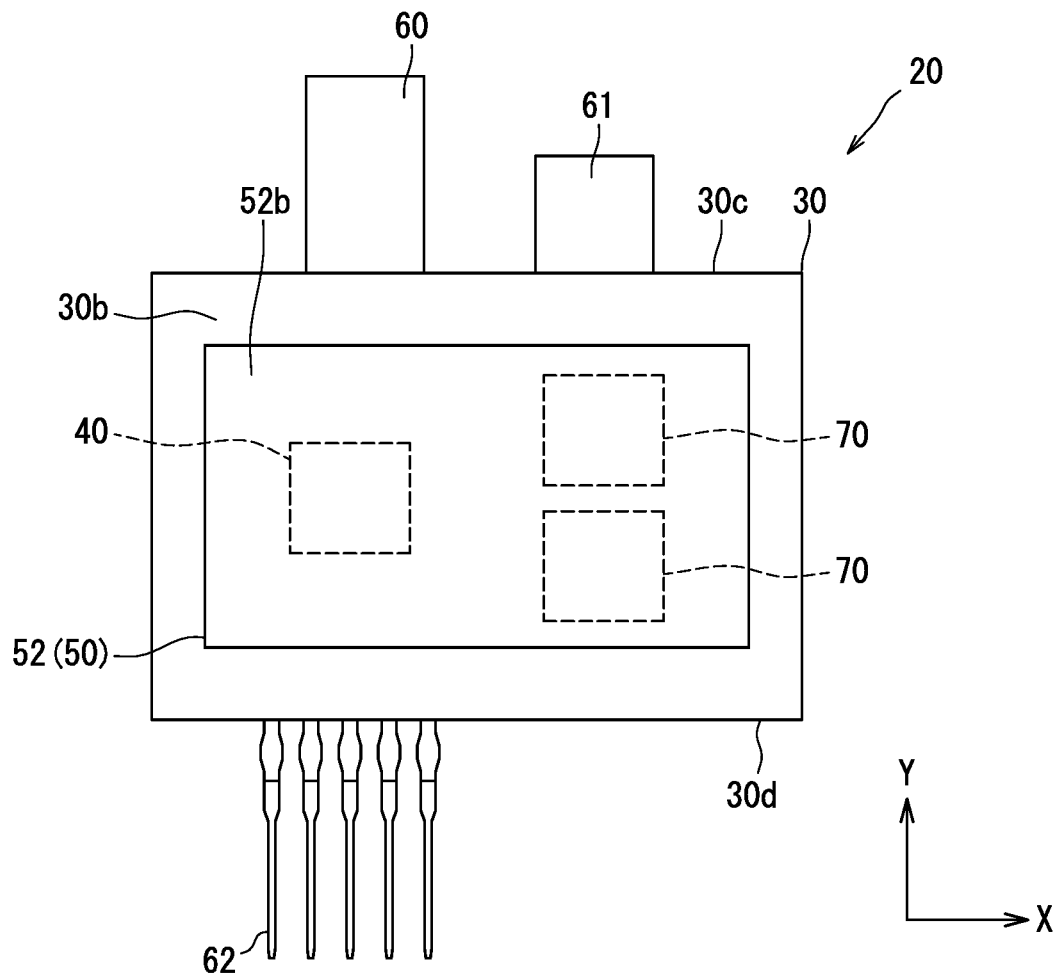
FIG. 10 is a plan view of a modification.

The configuration of the semiconductor device 20 is not limited to the above example. For example, as in a modification shown in FIG. 10, the semiconductor device 20 may include plural insulators 70. In FIG. 10, the semiconductor device 20 includes two insulators 70. The two insulators 70 are arranged side by side in the Y direction. By providing plural insulators 70, the number of columns that mechanically connect the heat sink 51 and the heat sink 52 increases. This makes it possible to divide and distribute the otherwise-concentrating stress acting on the molding of the sealing resin body 30 into two columns. It should be noted that the configuration may include three or more insulators 70. Further, the arrangement of the plural insulators 70 is not limited to the example shown in FIG. 10. For example, the line of arrangement of the plural insulators 70 may extend along the X direction.

Further, in the example of FIG. 10, the total area size of the plural insulators 70, that is, the sum of the area sizes of the insulators 70 is larger than the area size of the semiconductor element 40. In such manner, the same effects as that of the configuration shown in FIG. 8 can be obtainable.

Figure 11:
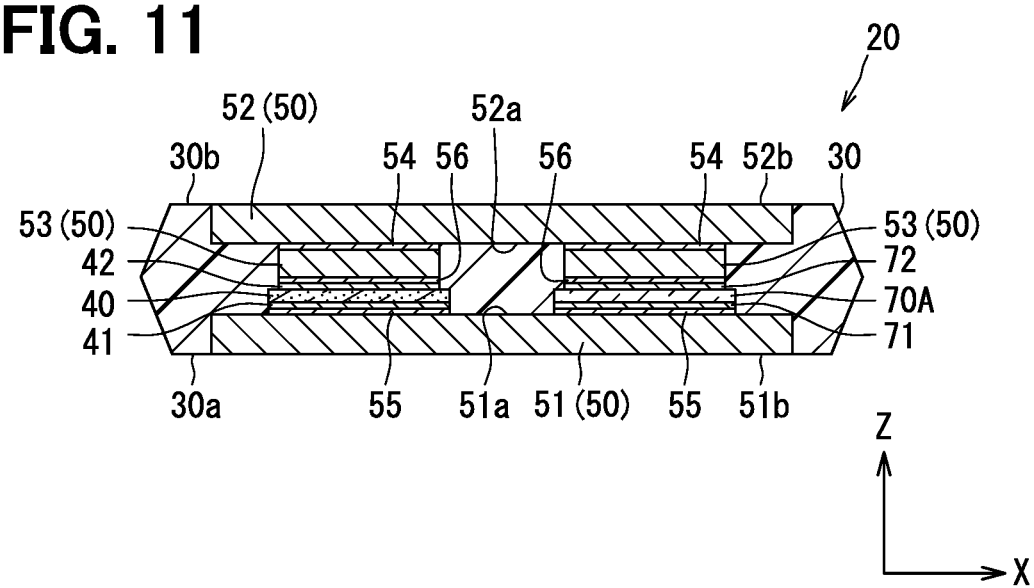
FIG. 11 is a cross-sectional view of a semiconductor device according to a third embodiment.

Third Embodiment, FIG. 11

The third embodiment is a modification of a preceding embodiment as a basic configuration and may incorporate description thereof. In the preceding embodiment, the non-conducting element 13 is the insulator 70. The insulator is not limited to such component.

FIG. 11 is a cross-sectional view showing the semiconductor device 20 of the present embodiment and corresponds to FIG. 3. The semiconductor device 20 includes an insulator 70A. The other configuration is the same as that of the first embodiment. The insulator 70A has joints 71 and 72 on both surfaces of an insulating base material. The insulating base material is formed by using an inorganic material having an electric insulating property such as glass, ceramics, and semiconductors. The non-conducting element 13 is not formed on the insulator 70A, that is, the insulating base material.

The insulator 70A has a breakdown voltage equal to or higher than that of the semiconductor element 40 by using an insulating base material made of an inorganic material. Further, the insulator 70A electrically separates (i) the heat sink 51, which is the first wiring member, from (ii) the heat sink 52, which is the second wiring member, and the terminal 53. Therefore, no electric current flows between the first wiring member and the second wiring member through the insulator 70A, and the operation of the semiconductor element 40 is not hindered under the use condition of the semiconductor device 20. The insulator 70A functions as a pillar that mechanically connects the heat sink 51 and the heat sink 52.

Summary of Third Embodiment

As shown in the present embodiment, the insulator 70A may be adoptable to function as an insulator by utilizing the characteristics of the base material. The semiconductor device 20 including the insulator 70A can also achieve the same effects as the semiconductor device 20 including the insulator 70. It may be preferable to use, for the insulator 70, a material having a linear expansion coefficient close to that of the base material forming the semiconductor element 40.

The configuration of the present embodiment and the configuration of the second embodiment may be combinable. The present embodiment can achieve the same effects as the configuration described in the second embodiment. For example, the area size of the insulator 70A may be larger than the area size of the semiconductor element 40. Also, the configuration may include plural insulators 70A. The total area size of the plural insulators 70A may be larger than the area size of the semiconductor element 40.

Other Embodiments

The present disclosure in the specification and drawings is not limited to the exemplified embodiments. The present disclosure encompasses the illustrated embodiments as well as modifications of the embodiments by those skilled in the art. For example, the present disclosure is not limited to the combination of parts and/or elements shown in the embodiments. The present disclosure may be implemented in various combinations. The present disclosure may have additional portions that may be added to the embodiments. The present disclosure encompasses omission of components and/or elements of the embodiments. The present disclosure encompasses the replacement or combination of components and/or elements between one embodiment and the other. The disclosed technical scope is not limited to the description of the embodiments. It is to be understood that some technical scopes disclosed are shown by the description of the claims, and further include meanings equivalent to the description of the claims and all modifications within the scope.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

Although the example in which the semiconductor device 20 includes the dummy terminal 62 is shown, the invention is not limited to such example. The dummy terminal 62 is optional, and may be omitted.

The number and arrangement of the main terminals 60 and 61 are not limited to the above example. For example, a configuration may be used in which at least one of the main terminals 60 and 61 is provided in plurality.

The circuit configuration of the converter 5 to which the semiconductor device 20 is applied is not limited to the above example. The number of phases of the converter 5 is not limited to polyphase. The number of phases therein may be a single phase. In case of adopting polyphase, the number of phases is not limited to four. In the leg 10 for one phase, the upper arms may have parallel configuration. For example, a parallel circuit of the SBD 12 and the non-conducting element 13 may be provided in two sets, and two sets of such parallel circuit may be connected in parallel with each other. The application target of the semiconductor device 20 is not limited to the upper arm of the converter 5 having the booster function.

The number of semiconductor elements 40 included in the semiconductor device 20 is not limited to the above example. As described above, when one upper arm is composed of two sets of parallel circuits, two semiconductor elements 40 and two insulators 70 (i.e., non-conducting elements 13) may be provided.

The configuration described in the present embodiment has a semiconductor element in which a vertical element is formed using a wide band gap semiconductor as a base material, a wiring member arranged to sandwich the semiconductor element, and a sealing resin body for integrally sealing the semiconductor element and the wiring member. In such configuration, by adding an insulator, it is possible to reduce the stress acting on the semiconductor element at the time of molding the sealing resin body thereby provide a highly reliable semiconductor device. The vertical element is not limited to the SBD 12 described above. The vertical element may also be a switching element such as MOSFET or the like.

In the plan view, the area size of the insulator 70 (or 70A) may be made smaller than the area size of the semiconductor element 40. By providing the insulator 70 (or 70A), the stress acting on the semiconductor element 40 can be reduced as compared with a configuration without having the insulator 70/70A.

Although the example in which the second wiring member includes the heat sink 52 and the terminal 53 is shown, the present disclosure is not limited to such an example. The terminal 53 may be omissible. For example, instead of the terminal 53, the heat sink 52 may be provided with a protrusion protruding toward the semiconductor element 40.

The example in which the outer surfaces 51b and 52b of the heat sinks 51 and 52 are exposed from the sealing resin body 30 has been shown, but the present invention is not limited to such an example. The outer surfaces 51b and 52b may be configured not to be exposed from the sealing resin body 30.

What is claimed is:

1. A semiconductor device comprising:
   a semiconductor element having:
      a first main electrode formed on a first main surface and made of a wide band gap semiconductor as a base material; and
      a second main electrode formed on a second main surface opposite to the first main surface;
   a wiring member arranged to sandwich the semiconductor element, including a first wiring member arranged on the first main surface side and electrically connected to the first main electrode and a second wiring member arranged on the second main surface side and electrically connected to the second main electrode;
   a sealing resin body for integrally sealing the semiconductor element and the wiring member; and
   at least one insulator that is also sandwiched by the wiring member, and has a first joint joining to the first wiring member and a second joint joining to the second wiring member,
   the at least one insulator is a non-conducting element in which plural diodes are formed in a semiconductor substrate and the plural diodes are connected in series so that forward directions of the plural diodes are opposite to each other in series connection,
   the at least one insulator is connected in parallel to the semiconductor element, and
   the at least one insulator is insulative and electrically separating the first wiring member from the second wiring member.

2. The semiconductor device according to claim 1, wherein
   an area size of the insulator is larger than an area size of the semiconductor element in a plan view of the semiconductor element seen from a plate thickness direction.

3. The semiconductor device according to claim 2, wherein
   there is only one insulator in the semiconductor device, and
   the area size of the insulator is larger than the area size of the semiconductor element.

4. The semiconductor device according to claim 2, wherein
   plural insulators are provided, and
   a total area size of the plural insulators is larger than the area size of the semiconductor element.

5. The semiconductor device according to claim 1, wherein the semiconductor element and the insulator are arranged side by side along a longitudinal direction of the wiring member.

6. The semiconductor device according to claim 5, wherein
the semiconductor element is arranged in one region and the insulator is arranged in an other region when the wiring member is cut in half into two regions by a virtual center line (CL) of the wiring member extending perpendicular to the longitudinal direction thereof.

7. A semiconductor device comprising:
a lower heat sink;
a left first solder located directly on top of a left portion of the lower heat sink;
a semiconductor element made of a wide band gap semiconductor as a base material and including a lower main electrode and an upper main electrode, wherein the lower main electrode is located directly on top of the first solder;
a left second solder located directly on top of the upper main electrode;
a left terminal located directly on top of the second solder;
a left third solder located directly on top of the left terminal;
a left portion of an upper heat sink located directly on top of the left third solder;
a right first solder located directly on top of a right portion of the lower heat sink;
a lower joint located directly on top of the right first solder;
an insulator located directly on top of the lower joint;
an upper joint located directly on top of the insulator;
a right second solder located directly on top of the upper joint;
a right terminal located directly on top of the right second solder;
a right third solder located directly on top of the right terminal;
a right portion of the upper heat sink located directly on top of the right third solder,
wherein
the insulator is a non-conducting element in which plural diodes are formed in a semiconductor substrate and the plural diodes are connected in series so that forward directions of the plural diodes are opposite to each other in series connection,
the insulator is connected in parallel to the semiconductor element, and
the insulator is insulative and electrically separating the first wiring member from the second wiring member.

8. The semiconductor device of claim 7, further comprising:
a sealing resin body including: (i) a central portion located between the semiconductor element and the insulator, and (ii) peripheral portion surrounding left, right, front, and back sides of the lower heat sink, and surrounding left, right, front, and back sides of the upper heat sink,
wherein a lower outer surface of the lower heat sink is flush with a lower surface of the sealing resin body, such that the lower outer surface is not covered by the resin sealing body, and
wherein an upper surface of the upper heat sink is flush with an upper surface of the sealing resin body, such that the upper surface is NOT covered by the sealing resin body.

9. The semiconductor device of claim 8, further comprising:
a left main terminal extending substantially rearward through a rear side surface of the sealing resin body, and electrically connected with the lower heat sink; and
a right main terminal extending substantially rearward through the rear side surface of the sealing resin body, and electrically connected with the upper heat sink;
a dummy terminal entering a front side surface of the sealing resin body, and NOT in electrical communication with the semiconductor element.

10. The semiconductor device of claim 8, wherein the semiconductor element is substantially a mirror image of the insulator with respect to a front-to-rear centerline when viewed in a plan view, such that stresses are symmetrically distributed about the centerline.

11. The semiconductor device of claim 8,
wherein the semiconductor element is a Schottky barrier diode, and
wherein the insulator includes a pair of PN diodes, such that the semiconductor device is configured for use as an upper arm in one leg of a converter.

12. The semiconductor device of claim 8, further comprising:
dummy terminals entering a front side surface of the sealing resin body, and NOT in electrical communication with the semiconductor element, such that the dummy terminals are configured for fixing the semiconductor device to a circuit board during a manufacturing process.

13. The semiconductor device according to claim 1, wherein
the at least one insulator is formed in a chip having silicon as a base material,
the at least one insulator includes a first PN diode and a second PN diode,
an anode of the first PN diode and an anode the second PN diode are connected to each other,
a cathode of the first PN diode is connected to an anode of the semiconductor element, and
a cathode of the second PN diode is connected to a cathode of the semiconductor element.

14. The semiconductor device according to claim 1, wherein
the at least one insulator is formed in a chip having silicon as a base material,
the at least one insulator includes a first PN diode and a second PN diode,
a cathode of the first PN diode and a cathode of the second PN diode are connected to each other,
an anode of the first PN diode is connected to an anode of the semiconductor element, and
an anode of the second PN diode is connected to a cathode of the semiconductor element.

15. The semiconductor device according to claim 7, wherein
the insulator is formed in a chip having silicon as a base material,
the insulator includes a first PN diode and a second PN diode,
an anode of the first PN diode and an anode the second PN diode are connected to each other,
a cathode of the first PN diode is connected to an anode of the semiconductor element, and
a cathode of the second PN diode is connected to a cathode of the semiconductor element.

16. The semiconductor device according to claim 7, wherein
the insulator is formed in a chip having silicon as a base material,
the insulator includes a first PN diode and a second PN diode,
a cathode of the first PN diode and a cathode of the second PN diode are connected to each other,
an anode of the first PN diode is connected to an anode of the semiconductor element, and
an anode of the second PN diode is connected to a cathode of the semiconductor element.

* * * * *